(12) United States Patent
Huang et al.

(10) Patent No.: US 11,495,511 B2
(45) Date of Patent: Nov. 8, 2022

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: Yu-Che Huang, Kaohsiung (TW); Lu-Ming Lai, Kaohsiung (TW); Ying-Chung Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/006,664

(22) Filed: Aug. 28, 2020

(65) Prior Publication Data
US 2022/0068747 A1    Mar. 3, 2022

(51) Int. Cl.
*H01L 23/32* (2006.01)
*H01L 23/498* (2006.01)
*H01L 21/48* (2006.01)

(52) U.S. Cl.
CPC .......... *H01L 23/32* (2013.01); *H01L 21/4846* (2013.01); *H01L 23/49861* (2013.01)

(58) Field of Classification Search
CPC .......................... H01L 23/32; H01L 23/49861
See application file for complete search history.

(56) References Cited

U.S. PATENT DOCUMENTS

| 2013/0020689 A1* | 1/2013 | Mei | H01L 24/49 257/676 |
| 2013/0299845 A1* | 11/2013 | Nomoto | H01L 24/97 257/693 |

\* cited by examiner

*Primary Examiner* — Peniel M Gumedzoe
(74) *Attorney, Agent, or Firm* — Foley & Lardner LLP

(57) ABSTRACT

A semiconductor package structure and a method for manufacturing a semiconductor package structure are provided. The semiconductor package structure includes a semiconductor package device, a first constraint structure and a second constraint structure. The first constraint structure is connected to the semiconductor package device. The second constraint structure is connected to the semiconductor package device and under a projection of the semiconductor package device.

17 Claims, 8 Drawing Sheets

SEMICONDUCTOR PACKAGE STRUCTURE AND METHOD FOR MANUFACTURING THE SAME

BACKGROUND

1. Technical Field

The present disclosure relates generally to a semiconductor package structure and a method for manufacturing a semiconductor package structure.

2. Description of the Related Art

Inertial measurement units (IMUs) are widely used in various applications, for example, noise and vibration in brake systems of vehicles, and small outline integrated circuit (SOIC) packages may be used to for packaging the IMUs. However, the functions of the IMUs may be easily affected by resonance frequencies generated from other devices. For example, if the frequency of the first or higher resonance mode of the SOIC coincides with the resonance frequency generated from the adjacent devices, the structural integrity of the SOIC may prone to be deteriorated.

SUMMARY

In one or more embodiments, a semiconductor package structure includes a semiconductor package device, a first constraint structure and a second constraint structure. The first constraint structure is connected to the semiconductor package device. The second constraint structure is connected to the semiconductor package device and under a projection of the semiconductor package device.

In one or more embodiments, a semiconductor package structure includes a semiconductor package device, a first constraint structure and a second constraint structure. The first constraint structure is connected to the semiconductor package device. The second constraint structure is connected to the semiconductor package device. The second constraint structure includes a substrate core layer and a metal layer. The metal layer is formed on the substrate core layer. A surface of the first constraint structure is substantially coplanar with a surface of the second constraint structure.

In one or more embodiments, a method for manufacturing a semiconductor package structure includes the following operations: providing a semiconductor package device including a first constraint structure; and connecting a second constraint structures to the semiconductor package device, wherein the second constraint structure is under a projection of the semiconductor package device.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
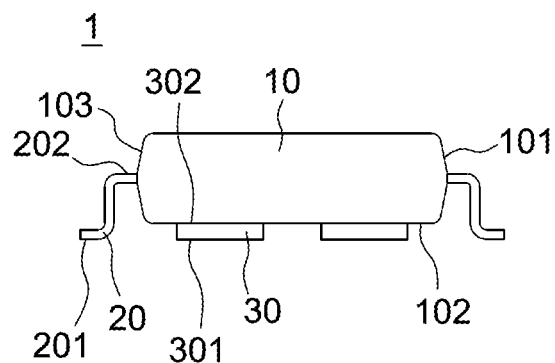
FIG. 1A illustrates a cross-sectional view of a semiconductor package structure in accordance with some embodiments of the present disclosure.

FIG. 1A illustrates a cross-sectional view of a semiconductor package structure 1 in accordance with some embodiments of the present disclosure. The semiconductor package structure 1 (also referred to as "an electronic device") includes a semiconductor package device 10 and constraint structures 20 and 30. The constraint structure referred herein directs to the components on the semiconductor package structure that function as connection terminals to an integration platform, for example, a printed circuit board (PCB), by way of suitable bonding techniques. Alternatively stated, the semiconductor package device 10 can be fixed to the integration platform via a plurality of constraint structures.

The semiconductor package device 10 has a surface 101 (also referred to as "a lateral surface"), a surface 103 (also referred to as "a lateral surface") opposite to the surface 101, and a surface 102 (also referred to as "a bottom surface") angled with the surface 101. In some embodiments, the surface 102 is extending from the surface 101 to the surface 103. In some embodiments, the semiconductor package device 10 may be a small sized package, such as a small outline package (SOP), a small outline integrated circuit (SOIC), or the like. In some embodiments, the semiconductor package device 10 may include an inertial measurement unit (IMU). In some embodiments, the semiconductor package device 10, when in the absence of the constraint structure 30, may have a first-mode resonance frequency of lower than 20 kHz. In some embodiments, the semiconductor package device 10 may have a first-mode resonance frequency of lower than 15 kHz. In some embodiments, the semiconductor package device 10 may have a size of equal to or smaller than 15 mm*10 mm*5 mm. In some embodiments, the semiconductor package device 10 may have a size of equal to or smaller than 12 mm*8 mm*4 mm. In some other embodiments, the semiconductor package device 10 may include a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof. As previously discussed, noise and vibration in brake systems of vehicles may have a frequency range overlapping with the first-mode resonance frequency of the SOIC. To avoid the frequency overlapping, the constraint structure 30 is further implemented on the semiconductor package device 10, as illustrated in FIG. 1A.

The constraint structure 20 is connected to the semiconductor package device 10. In some embodiments, the constraint structure 20 is electrically connected to the semiconductor package device 10. The constraint structure 20 may also refer to an electronic structure. In some embodiments, the semiconductor package structure 1 includes a plurality of the constraint structures 20. In some embodiments, the constraint structures 20 are connected to the lateral surface (s) (e.g., the surface 101 and the surface 103) of the semiconductor package device 10. In some embodiments, the constraint structure 20 is made of or includes a conductive material. In some embodiments, the constraint structure 20 is made of or includes a metal material. In some embodiments, the constraint structure 20 includes a lead pin. In some embodiments, the semiconductor package device 10 may include sixteen constraint structures 20.

The constraint structure 30 is connected to the semiconductor package device 10 and under a projection of the semiconductor package device 10. The constraint structure 30 may also refer to a support structure. In some embodiments, the semiconductor package structure 1 includes a plurality of the constraint structures 30. In some embodiments, the constraint structures 30 are connected to the bottom surface (e.g., the surface 102) of the semiconductor package device 10. In some embodiments, the constraint structures 30 are directly attached to the bottom surface (e.g., the surface 102) of the semiconductor package device 10.

In some embodiments, a surface 201 (also referred to as "a bottom surface") of the constraint structure 20 is substantially coplanar with a surface 301 (also referred to as "a bottom surface") of the constraint structure 30. In some embodiments, the constraint structure 20 has a surface 202 (also referred to as "an upper surface") opposite to the surface 201, the constraint structure 30 has a surface 302 (also referred to as "an upper surface") opposite to the surface 301, and the surface 302 is between the surface 201 and the surface 202. In some embodiments, the surface 201 is the bottommost surface of the constraint structure 20, and the surface 202 is the uppermost surface of the constraint structure 20.

In some embodiments, the constraint structure 30 includes a printed circuit board (PCB). The PCB may include a multi-layered structure including a conductive layer and/or a metal layer. In some embodiments, the constraint structure 30 includes an adhesive layer. The adhesive layer may be free from a conductive layer and/or a metal layer. In some embodiments, the constraint structure 30 may have a size of equal to or smaller than 6 mm*3 mm*0.6 mm. In some embodiments, the constraint structure 30 may have a size of equal to or smaller than 4 mm*2 mm*0.4 mm.

According to some embodiments of the present disclosure, with the arrangement of the constraint structure(s) 30, the constraint condition of the semiconductor package structure 1 is modified by producing additional nodes for standing waves generated from the semiconductor package device 10, and as the wavelengths of the standing waves are reduced resulted from the production of additional nodes, the first-mode resonance frequency of the semiconductor package device 10 can be increased. In other words, the stiffness of the semiconductor package structure 1 implemented with the constraint structure 301 is greater than the counterpart without implementation of the constraint structure 301, and hence different resonance frequencies follow. Therefore, the damage to the structures (e.g., the semiconductor package device 10) or undesired interference caused by low-frequency noise can be effectively prevented.

In addition, according to some embodiments of the present disclosure, the bottom surface of the constraint structure 20 is substantially coplanar with the bottom surface of the constraint structure 30, such that the semiconductor package device 10 with the constraint structures 20 and 30 can be readily disposed on and bonding to a surface of an external carrier or substrate without modifying the bonding surface of the external carrier or substrate. In addition, the semiconductor package device 10 with the constraint structures 20 and 30 can be readily bonded to an external carrier or substrate in a single operation by, for example, surface mount technology (SMT). Therefore, the process for manufacturing the semiconductor package structure 1 is simplified, and the bonding portions between the coplanar surfaces of the constraint structures 20 and 30 and the bonding surface of the external carrier or substrate can be formed to be relatively stable and less vulnerable to damages.

Moreover, compared to the cases where an adhesive or a gel is used to attached a portion or an entire surface 102 of the semiconductor package device 10 to an external carrier or substrate, the adhesive or the gel may overflow to undesired regions of the semiconductor package device 10 during the process of applying the adhesive or the gel, and the adhesive or the gel has a relatively poor mechanical property under various application conditions. According to some embodiments of the present disclosure, the constraint structures 30 can be provided with a relatively precision arrangement and a greater mechanical property.

Figure 1B:
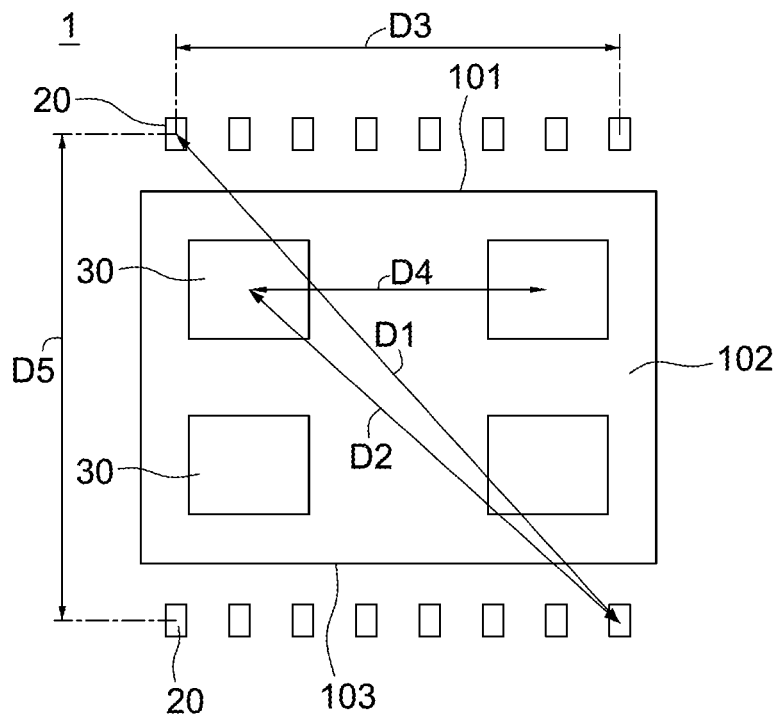
FIG. 1B illustrates a bottom view of a semiconductor package structure in accordance with some embodiments of the present disclosure.
Figure 1C:
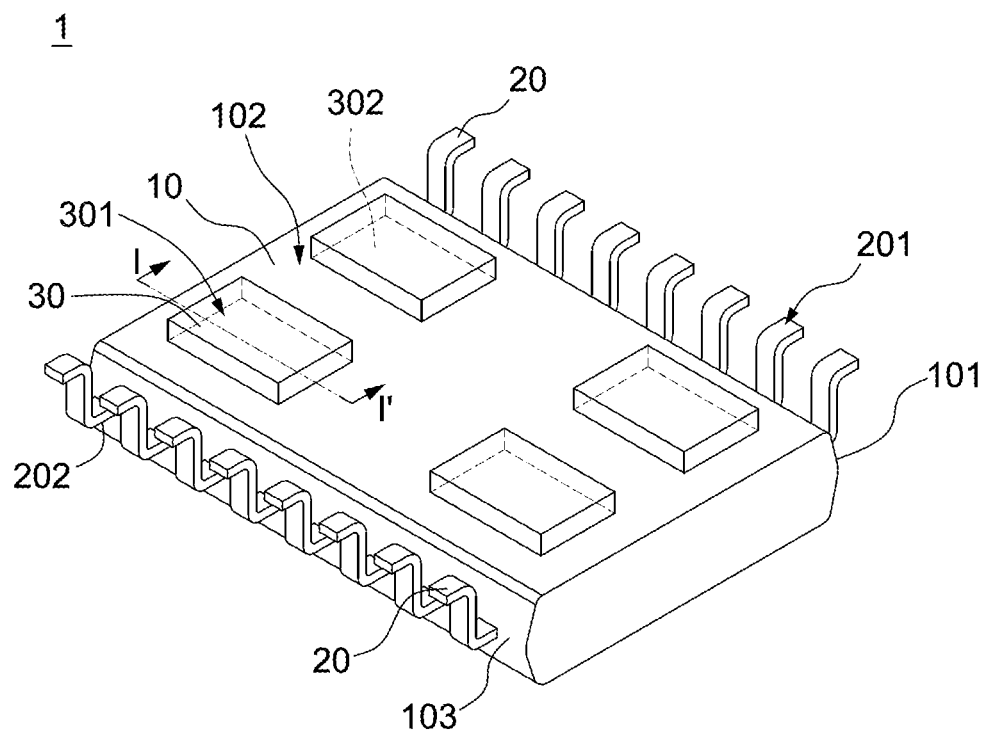
FIG. 1C illustrates a perspective view of a semiconductor package structure in accordance with some embodiments of the present disclosure.

FIG. 1B illustrates a bottom view of a semiconductor package structure 1 in accordance with some embodiments of the present disclosure, and FIG. 1C illustrates a perspective view of a semiconductor package structure 1 in accordance with some embodiments of the present disclosure.

As shown in FIG. 1B, the constraint structures 30 are connected to the bottom surface (e.g., the surface 102) of the semiconductor package device 10. In some embodiments, all of the constraint structures 30 are under the projection of the semiconductor package device 10, and all of the constraint structures 20 are outside of the projection of the semiconductor package device 10. In some embodiments, the constraint structures 30 are arranged between the two lateral surfaces (e.g., the surface 101 and the surface 103) of the semiconductor package device 10.

In some embodiments, a distance D1 between two of the constraint structures 20 is greater than a distance D2 between one of the constraint structures 20 and one of the constraint structures 30. In some embodiments, the distance D1 may be the maximum distance between two constraint structures 20, and the distance D2 may be the maximum distance between one constraint structure 20 and one constraint structure 30.

In some embodiments, a distance (e.g., distance D3) between two of the constraint structures 20 on the surface 101 is greater than a distance (e.g., distance D4) between two of the constraint structures 30 on the surface 102. In some embodiments, the distance D3 may be the maximum distance between two of the constraint structures 20 on the surface 101. In some embodiments, the distance D4 may be the maximum distance between two of the constraint structures 30 on the surface 102. In some embodiments, the distance (e.g., the distance D3) between two of the constraint structures 20 on the surface 101 is greater than a distance (e.g., the distance D2) between one of the constraint structures 20 and one of the constraint structures 30. In some embodiments, a distance (e.g., distance D5) between one of the constraint structures 20 on the surface 101 and one of the constraint structures 20 on the surface 103 is greater than the distance (e.g., the distance D2) between one of the constraint structures 20 and one of the constraint structures 30. In some embodiments, the distance (e.g., distance D5) between one of the constraint structures 20 on the surface 101 and one of the constraint structures 20 on the surface 103 is greater than the distance (e.g., the distance D4) between two of the constraint structures 30 on the surface 102. In some embodiments, the distance D5 may be the minimum distance between one of the constraint structures 20 on the surface 101 and one of the constraint structures 20 on the surface 103.

According to some embodiments of the present disclosure, the relatively smaller distance D2 generated from the arrangement of the constraint structures 30 indicates a modification of the constraint condition of the semiconductor package structure 1 compared to that without any constraint structure 30 and thereby a relatively greater distance D1 generated from the constraint structures 20; that is, the wavelength of the standing wave is reduced, and the first-mode resonance frequency is increased accordingly. Therefore, the damage to the structures or undesired interference caused by low-frequency noise can be effectively prevented.

In some embodiments, a ratio of a total area of the constraint structures 30 to an area of the surface 102 of the semiconductor package device 10 is greater than about 10%. In some embodiments, the ratio of the total area of the constraint structures 30 to the area of the surface 102 of the semiconductor package device 10 is greater than about 20%. In some embodiments, the ratio of the total area of the constraint structures 30 to the area of the surface 102 of the semiconductor package device 10 is greater than about 20% and less than about 90%. In some embodiments, the ratio of the total area of the constraint structures 30 to the area of the surface 102 of the semiconductor package device 10 is greater than about 20% and less than about 80%.

According to some embodiments of the present disclosure, with the aforesaid predetermined ratio of the areas of the constraint structures 30 to the surface 102 of the semiconductor package device 10, the constraint structures 30 can modify the constraint condition more efficiently by generating a greater amount of nodes for reducing the wavelength of the standing waves generated from the semiconductor package device 10, thereby increasing the frequency of the first-mode resonance. Damages caused by low-frequency noise from the environment or adjacent devices to the semiconductor package structure described herein can be further prevented. In addition, according to some embodiments of the present disclosure, with the ratio of the areas of the constraint structures 30 to the surface 102 of the semiconductor package device 10 being less than the upper limit of the aforesaid value(s), the constraint spots between the semiconductor package device 10 and an integration platform (e.g., a substrate 40 or a PCB, which will be discussed hereinafter), the flexibility of the overall package structure can be maintained at a relatively satisfying level with a sufficiently high first-mode resonance frequency. In the contrary, when the ratio of the areas of the constraint structures 30 to the surface 102 of the semiconductor package device 10 being greater than the upper limit of the aforesaid value(s), stress-induced warpage of the package structure may take place.

In some embodiments, the constraint structures 20 may be or include lead pins, and the constraint structures 30 may be or include singulated printed circuit boards (PCB). According to some embodiments of the present disclosure, PCBs are used as the constraint structures 30 since PCBs are known to be commercially available, and various types of PCBs have passed various reliability tests, the process for manufacturing the semiconductor package structure 1 is simplified, and the cost is reduced.

Figure 2:
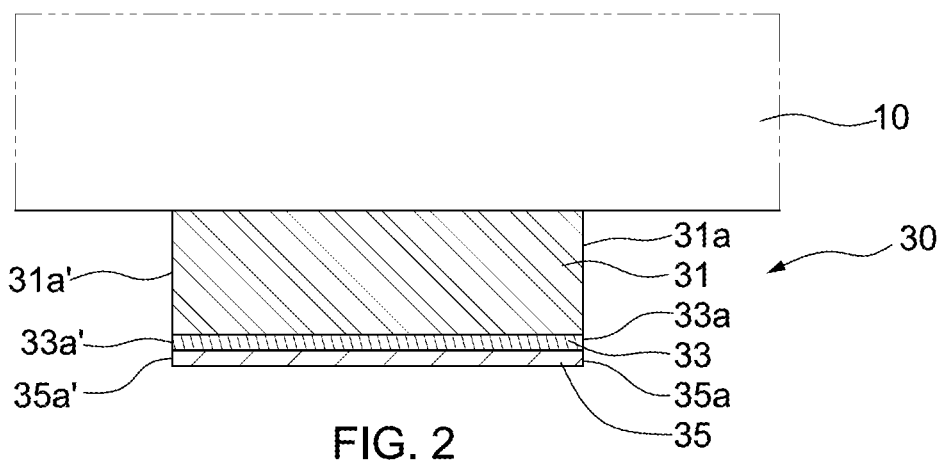
FIG. 2 illustrates a cross-sectional view of a constraint structure in accordance with some embodiments of the present disclosure.

FIG. 2 illustrates a cross-sectional view of a constraint structure 30 in accordance with some embodiments of the present disclosure. In some embodiments, FIG. 2 illustrates a cross-sectional view along the cross-sectional line I-I' in FIG. 1C. In some embodiments, the constraint structure 30 includes a substrate core layer 31, a metal layer 33, and a metal finish layer 35.

In some embodiments, the substrate core layer 31 is disposed on the semiconductor package device 10. For example, the substrate core layer 31 is in contact with an epoxy molding compound encapsulating the semiconductor package device 10. In some embodiments, the substrate core layer 31 may be or include an organic substrate layer. In some embodiments, the substrate core layer 31 may be or include a PCB, a SBS core layer, or a combination thereof. In some embodiments, a thickness of the substrate core layer 31 is from about 150 µm to about 200 µm. In some embodiments, a thickness of the substrate core layer 31 is from about 160 µm to about 180 µm. In some embodiments, the substrate core layer 31 may have a Young's modulus of about 14000 MPa to about 28000 MPa. In some embodiments, the substrate core layer 31 may have a Young's modulus of about 16000 MPa to about 26000 MPa.

In some embodiments, the substrate core layer 31 is between the semiconductor package device 10 and the metal layer 33. In some embodiments, the metal layer 33 is stacked with the substrate core layer 31. In some embodiments, a lateral surface (i.e., surface 31a) of the substrate core layer 31 is substantially aligned with a lateral surface (i.e., surface 33a) of the metal layer 33. In some embodiments, the lateral surfaces (i.e., surfaces 31a and 31a') of the substrate core layer 31 are substantially aligned with the lateral surfaces (i.e., surfaces 33a and 33a') of the metal layer 33. In some embodiments, the metal layer 33 may be or include a copper (Cu) layer. In some embodiments, a thickness of the metal layer 33 is from about 2 µm to about 10 µm.

In some embodiments, the metal finish layer 35 is stacked with the metal layer 33. In some embodiments, the metal finish layer 35 is formed directly on the metal layer 33. In some embodiments, a lateral surface (i.e., surface 35a) of the metal finish layer 35 is substantially aligned with a lateral surface (i.e., surface 33a) of the metal layer 33. In some embodiments, the lateral surfaces (i.e., surfaces 35a and 35a') of the metal finish layer 35 are substantially aligned with the lateral surfaces (i.e., surfaces 33a and 33a') of the metal layer 33. In some embodiments, the metal layer 33 may be or include a Ni/Au alloy layer, such as an ENIG (electroless nickel immersion gold) layer. In some embodiments, a thickness of the metal finish layer 35 is from about 2 μm to about 10 μm.

According to some embodiments of the present disclosure, the constraint structure 30 includes an organic substrate core layer 31 on one end and a metal finish layer 35 on an opposite end, such that the constraint structure 30 can bond to different structures formed of heterogeneous materials and provide relatively strong bonding strength between the structures (e.g., an organic encapsulant of the semiconductor package device 10 and a metal pad of an external carrier or substrate, which will be discussed hereinafter).

Figure 3A:
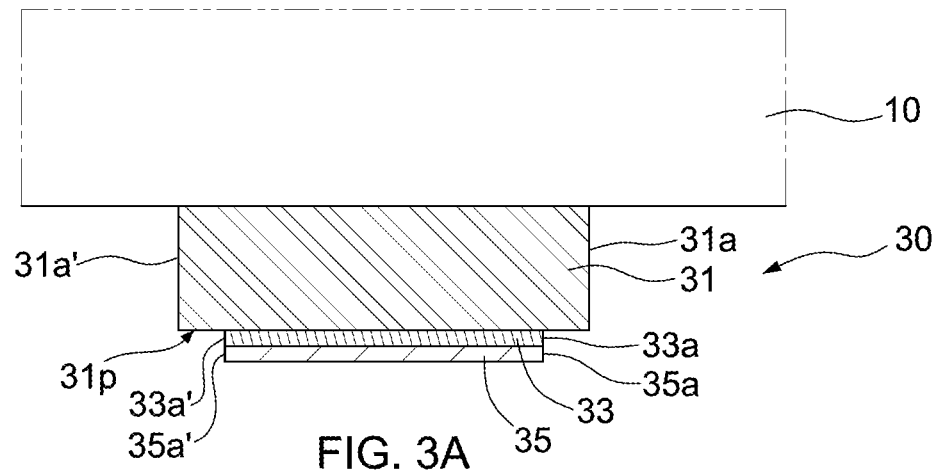
FIG. 3A illustrates a cross-sectional view of a constraint structure in accordance with some embodiments of the present disclosure.

FIG. 3A illustrates a cross-sectional view of a constraint structure 30A in accordance with some embodiments of the present disclosure.

In some embodiments, a peripheral region 31P of the substrate core layer 31 is exposed from the metal layer 33. In some embodiments, the lateral surfaces (i.e., surfaces 33a and 33a') of the metal layer 33 are recessed from the lateral surfaces (i.e., surfaces 31a and 31a') of the substrate core layer 31.

Figure 3B:
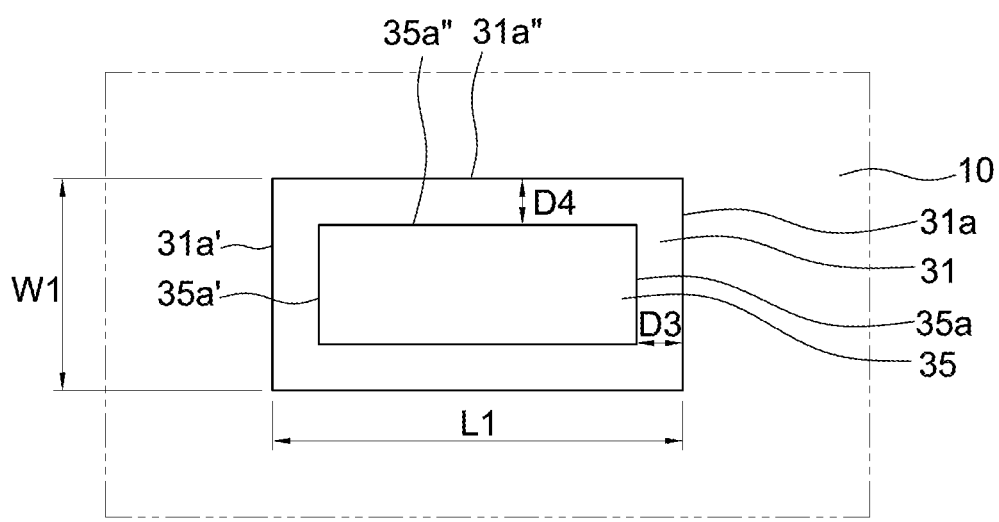
FIG. 3B illustrates a bottom view of a constraint structure in accordance with some embodiments of the present disclosure.

FIG. 3B illustrates a bottom view of a constraint structure 30A in accordance with some embodiments of the present disclosure.

In some embodiments, the surface 35a of the metal finish layer 35 is recessed from the surface 31a of the substrate core layer 31 by a distance D3 along a direction substantially in parallel to a length L1 of the substrate core layer 31. In some embodiments, the surface 35a" of the metal finish layer 35 is recessed from the surface 31a" of the substrate core layer 31 by a distance D4 along a direction substantially in parallel to a width W1 of the substrate core layer 31. In some embodiments, a ratio (L1/D3) of the length L1 to the distance D3 is from about 10 to about 30. In some embodiments, the ratio (L1/D3) of the length L1 to the distance D3 is from about 15 to about 25. In some embodiments, the ratio (L1/D3) of the length L1 to the distance D3 is about 20. In some embodiments, a ratio (W1/D4) of the length W1 to the distance D4 is from about 5 to about 20. In some embodiments, the ratio (W1/D4) of the length W1 to the distance D4 is from about 8 to about 15. In some embodiments, the ratio (W1/D4) of the length W1 to the distance D4 is about 10. In some embodiments, the length L1 is about 2 mm, the width W1 is about 1 mm, the distance D3 is about 0.1 mm, and the distance D4 is about 0.1 mm.

Figure 4:
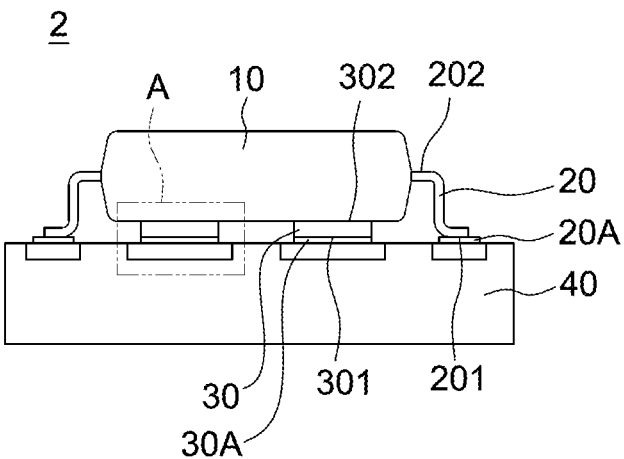
FIG. 4 illustrates a cross-sectional view of a semiconductor package structure in accordance with some embodiments of the present disclosure.

FIG. 4 illustrates a cross-sectional view of a semiconductor package structure 2 in accordance with some embodiments of the present disclosure. The semiconductor package structure 2 is similar to the semiconductor package structure 1 in FIG. 1A except that, for example, the semiconductor package structure 2 includes a substrate 40 and conductive bumps 20A and 30A.

In some embodiments, the substrate 40 is bonded to the semiconductor package device 10 through the constraint structures 20 and 30. In some embodiments, the substrate 40 may be or include a PCB. In some embodiments, the substrate 40 includes a metal pad 41 embedded or partially embedded in the substrate 40, and the constraint structure 30 is bonded to the metal pad 41 of the substrate 40. According to some embodiments of the present disclosure, the metal finish layer 35 of the constraint structure 30 is bonded to the metal pad 41 of the substrate 40, thus the homogeneous bonding can provide relatively strong bonding strength between the constraint structure 30 and the metal pad 41 of the substrate 40.

In some embodiments, the conductive bump 20A is disposed on the constraint structure 20. In some embodiments, the conductive bump 20A is formed on the surface 201 (also referred to as "the bottom surface") of the constraint structure 20. In some embodiments, the conductive bump 20A directly contacts the constraint structure 20 and the substrate 40.

In some embodiments, the conductive bump 30A is disposed between the constraint structure 30 and the substrate 40. In some embodiments, the conductive bump 30A directly contacts the constraint structure 30 and the substrate 40. In some embodiments, the conductive bump 30A is formed between the substrate 40 and the surface 301 (also referred to as "the bottom surface") of the constraint structure 30. In some embodiments, the conductive bump 30A is formed between the metal pad 41 of the substrate 40 and the surface 301 of the constraint structure 30. According to some embodiments of the present disclosure, the metal finish layer 35 of the constraint structure 30 is bonded to the conductive bump 30A which is bonded to the metal pad 41 of the substrate 40, thus the homogeneous bonding can provide relatively strong bonding strength between the constraint structure 30 and the metal pad 41 of the substrate 40.

In some embodiments, each of the conductive bumps 20A and 30A may be or include a solder paste. In some embodiments, each of the conductive paste 20A and 30A may be or include gold (Au), silver (Ag), copper (Cu), another metal, a solder alloy, or a combination of two or more thereof.

Figure 5A:
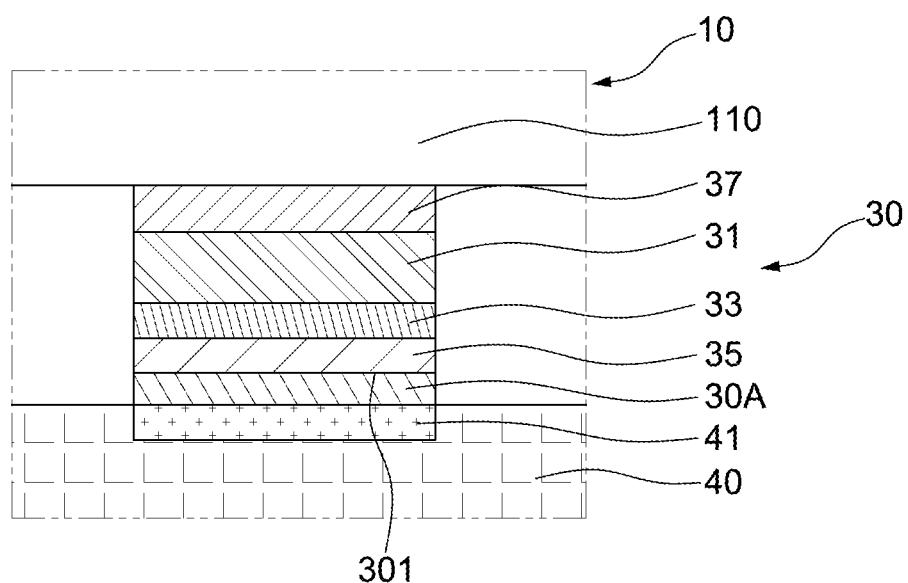
FIG. 5A illustrates an enlarged view of the structure in the box A as shown in FIG. 4 according to some embodiments of the present disclosure.

FIG. 5A illustrates an enlarged view of the structure in the box A as shown in FIG. 4 according to some embodiments of the present disclosure.

In some embodiments, the constraint structure 30 further includes a polymeric adhesive layer 37 between the semiconductor package device 10 and the substrate core layer 31. In some embodiments, the polymeric adhesive layer 37 is made of or includes a non-conductive material. In some embodiments, the constraint structure 30 is not electrically connected to the semiconductor package device 10 through the polymeric adhesive layer 37. In some embodiments, the metal layer 33 is electrically isolated from the semiconductor package device 10 by the polymeric adhesive layer 37. In some embodiments, the polymeric adhesive layer 37 may be or include an epoxy adhesive layer. In some embodiments, a thickness of the polymeric adhesive layer 37 is about 5 μm to about 8 μm. In some embodiments, a thickness of the polymeric adhesive layer 37 is about 6.5 μm.

In some embodiments, the semiconductor package device 10 further includes an encapsulant layer 110, and the polymeric adhesive layer 37 directly contacts the encapsulant layer 110 and the substrate core layer 31. In some embodiments, the encapsulant layer 110 includes an epoxy molding compound, and the polymeric adhesive layer 37 includes an epoxy adhesive.

According to some embodiments of the present disclosure, the organic substrate core layer 110 of the constraint structure 30 is bonded to the organic encapsulant layer 110 of the substrate 40, thus the homogeneous bonding can provide relatively strong bonding strength between the constraint structure 30 and the encapsulant layer 110 of the semiconductor package device 10.

In addition, according to some embodiments of the present disclosure, the organic substrate core layer 110 of the constraint structure 30 is bonded to the polymeric adhesive layer 37 which is bonded to the encapsulant layer 110 of the semiconductor package device 10, thus the homogeneous bonding can provide relatively strong bonding strength between the constraint structure 30 and the encapsulant layer 110 of the semiconductor package device 10.

Figure 5B:
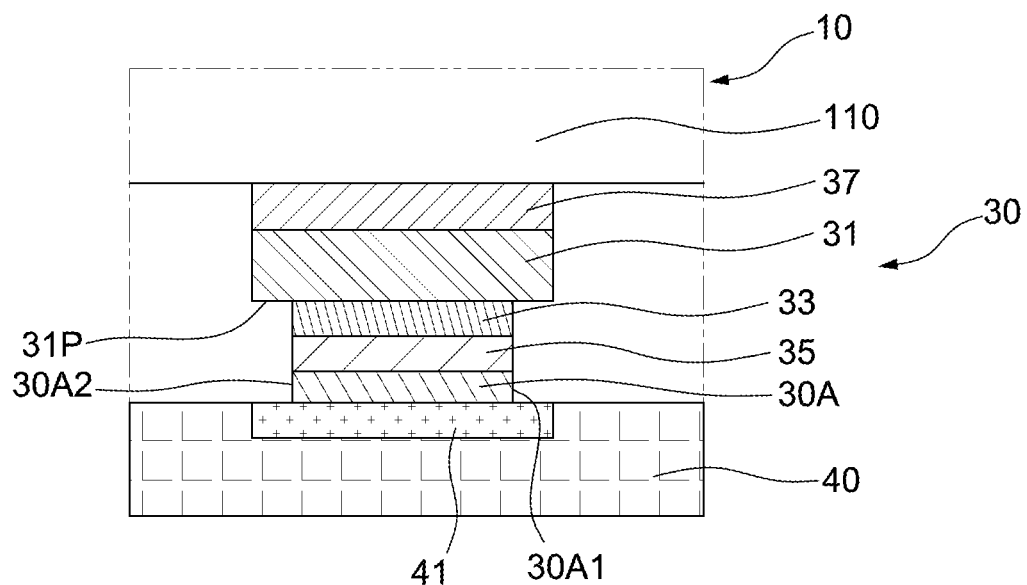
FIG. 5B illustrates an enlarged view of the structure in the box A as shown in FIG. 4 according to some embodiments of the present disclosure.

FIG. 5B illustrates an enlarged view of the structure in the box A as shown in FIG. 4 according to some embodiments of the present disclosure. The structure illustrated in FI. 5B is similar to that illustrated in FIG. 5A except that, for example, a peripheral region 31P of the substrate core layer 31 is exposed from the metal layer 33. In some embodiments, the lateral surfaces (i.e., surfaces 33a and 33a') of the metal layer 33 are recessed from the lateral surfaces (i.e., surfaces 31a and 31a) of the substrate core layer 31.

In some embodiments, a lateral surface (i.e., surface 30A1) of the conductive bump 30A is substantially aligned with a lateral surface (i.e., surface 33a) of the metal layer 33. In some embodiments, the lateral surfaces (i.e., surfaces 30A1 and 30A2) of the conductive bump 30A are substantially aligned with the lateral surfaces (i.e., surfaces 33a and 33a') of the metal layer 33.

Figure 6A:
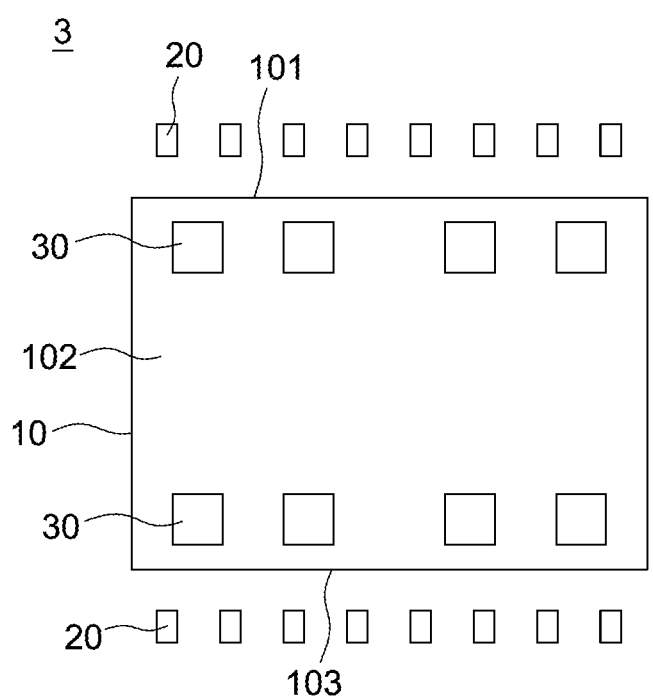
FIG. 6A illustrates a bottom view of a semiconductor package structure in accordance with some embodiments of the present disclosure.

FIG. 6A illustrates a bottom view of a semiconductor package structure 3 in accordance with some embodiments of the present disclosure.

In some embodiments, the constraint structures 30 are arranged between the two lateral surfaces (e.g., the surface 101 and the surface 103) of the semiconductor package device 10. In some embodiments, the constraint structures 30 are arranged in two rows adjacent to the surface 101 and the surface 103 of the semiconductor package device 10. In some embodiments, the rows of the constraint structures 30 are substantially in parallel to the rows of the constraint structures 20.

Figure 6B:
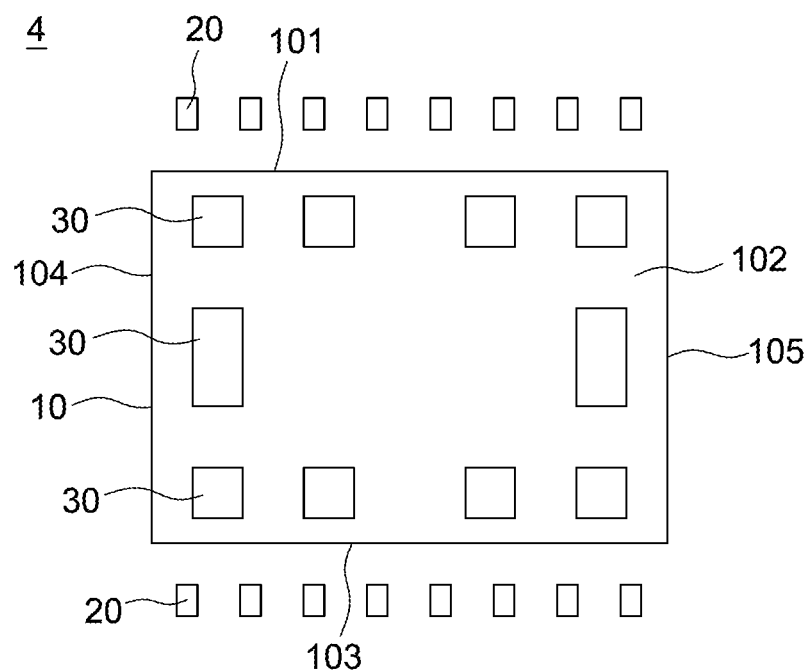
FIG. 6B illustrates a bottom view of a semiconductor package structure in accordance with some embodiments of the present disclosure.

FIG. 6B illustrates a bottom view of a semiconductor package structure 4 in accordance with some embodiments of the present disclosure.

In some embodiments, the constraint structures 30 are arranged along the lateral surfaces (e.g., the surface 101, 103, 104 and 105) of the semiconductor package device 10. In some embodiments, the constraint structures 30 are arranged adjacent to the lateral surfaces (e.g., the surface 101, 103, 104 and 105) of the semiconductor package device 10. In some embodiments, the semiconductor package device 10 further has a surface 104 (also referred to as "a lateral surface") connected to the surface 101 and the surface 102, and an amount of the constraint structures 30 adjacent to the surface 101 is greater than an amount of the constraint structures 30 adjacent to the surface 104.

In some embodiments, the surfaces 101 and 103 refer to the long sides of the bottom surface (i.e., the surface 102) of the semiconductor package device 10, as compared to the surfaces 104 and 105, and the constraint structures 20 and 30 are arranged adjacent to the long sides of the bottom surface (i.e., the surface 102) of the semiconductor package device 10. In some other embodiments, the surfaces 104 and 105 may refer to the long sides of the bottom surface of the semiconductor package device 10 (not shown in FIG. 6B), the constraint structures 30 may be arranged adjacent to the long sides (i.e., the surfaces 104 and 105) of the bottom surface of the semiconductor package device 10, and the constraint structures 20 may be arranged adjacent to the short sides (i.e., the surfaces 101 and 103) of the bottom surface of the semiconductor package device 10.

Table 1 shows resonance frequencies of various embodiments of the present disclosure. A1 refers to a structure similar to the semiconductor package structure 1 in the absence of any constraint structures 30, E1 refers to a structure similar to the semiconductor package structure 1 of FIG. 1A, E2 refers to a structure similar to the semiconductor package structure 3 of FIG. 6A, and E3 refers to a structure similar to the semiconductor package structure 4 of FIG. 6B.

TABLE 1

|  | A1 | E1 | E2 | E3 |
| --- | --- | --- | --- | --- |
| First-mode [kHz] | 11 | 57 | 58 | 75 |
| Second-mode [kHz] | 11 | 58 | N/A | N/A |
| Third-mode [kHz] | 17 | 64 | N/A | N/A |
| Fourth-mode [kHz] | 26 | 75 | N/A | N/A |
| Fifth-mode [kHz] | 27 | N/A | N/A | N/A |
| Sixth-mode [kHz] | 54 | N/A | N/A | N/A |

As shown in Table 1, it is apparent that with the arrangements of the constraint structure 30 according to some embodiment of the present disclosure (i.e., E1, E2, and E3), the first-mode resonance frequency can be significantly increased, for example, from about 11 kHz to at least about 57 kHz, thus the overlapping of the first-mode resonance frequency with the low-frequency noise from the environment can no longer take place. As a result, structural damages caused to the structures (e.g., the semiconductor package device 10) or undesired interference caused by low-frequency noise can be prevented.

FIG. 7A, FIG. 7B, FIG. 7C, FIG. 7D, FIG. 7E and FIG. 7F illustrate various operations in a method of manufacturing a semiconductor package structure 5 in accordance with some embodiments of the present disclosure.

Figure 7A:
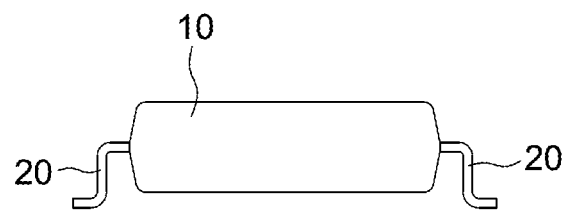
FIG. 7A, FIG. 7B, FIG. 7C, FIG. 7D, and FIG. 7E illustrate various operations in a method of manufacturing a semiconductor package structure in accordance with some embodiments of the present disclosure.

Referring to FIG. 7A, a semiconductor package device 10 including one or more constraint structures 20 is provided. In some embodiments, the semiconductor package device 10 may be or include a SOIC or SOP including multiple lead pins.

Figure 7B:
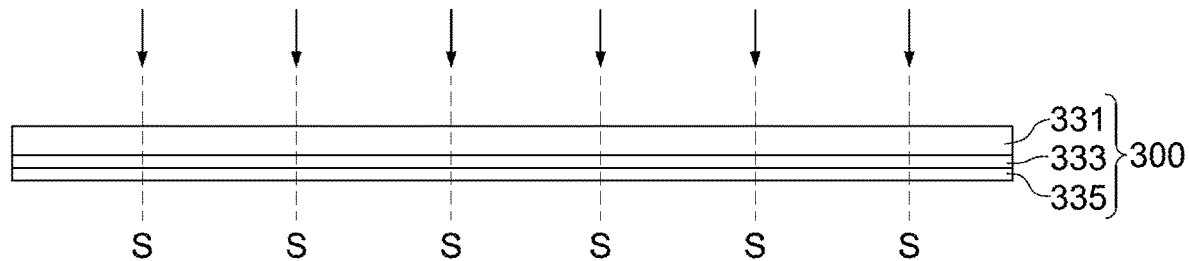

Referring to FIG. 7B, a multi-layered structure 300 is provided, and a singulation operation is performed on the multi-layered structure 300 to form a plurality of constraint structures 30. The multi-layered structure 300 may be cut along scribe lines S into separate constraint structures 30. In some embodiments, the multi-layered structure 300 includes a substrate core layer 331, a metal layer 333, and a metal finish layer 335. In some embodiments, the multi-layered structure 300 may be or include a PCB. In some embodiments, the singulation operation is performed prior to connecting the constraint structure(s) 30 to the semiconductor package device 10.

Figure 7C:
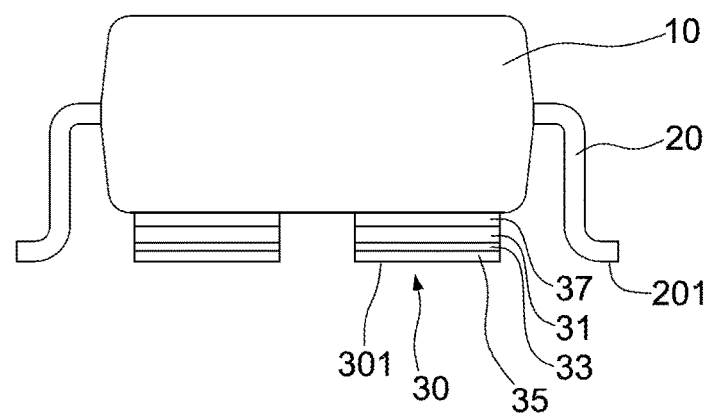

Referring to FIG. 7C, the constraint structures 30 is connected to the semiconductor package device 10, and the constraint structure 30 is under a projection of the semiconductor package device 10. In some embodiments, one or more constraint structures 30 are connected to the bottom surface (i.e., the surface 102) of the semiconductor package device 10. In some embodiments, a surface 201 (also referred to as "a bottom surface") of the constraint structure 20 is substantially coplanar with a surface 301 (also referred to as "a bottom surface") of the constraint structure 30.

Figure 7D:
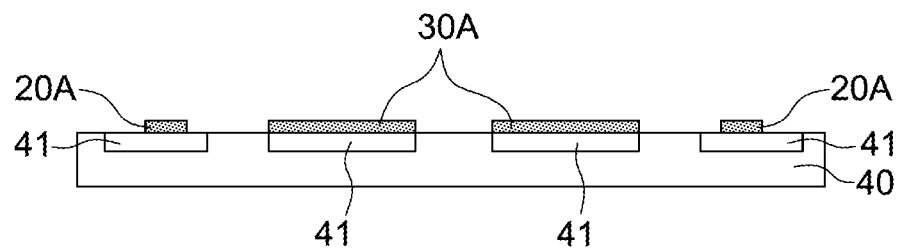

Referring to FIG. 7D, a substrate 40 including metal pads 41 embedded there-in is provided, and conductive bumps 20A and 30A are disposed on the metal pads 41. In some embodiments, the metal pads 41 with the conductive bumps 20A and 30A disposed thereon are predetermined ones for subsequently bonding to the constraint structures 20 and 30. In some embodiments, the substrate 40 may be or include a PCB. In some embodiments, the conductive bumps 20A and 30A may be or include solder pastes. In some embodiments, the conductive bumps 20A and 30A may be or include gold (Au), silver (Ag), copper (Cu), another metal, a solder alloy, or a combination of two or more thereof. According to some embodiments of the present disclosure, with the conductive bumps 20A and 30A (e.g., solder pastes) both being disposed on the substrate 40, for example, in a single operation, the heights of the conductive bumps 20A and 30A can be relatively uniform prior to bonding, and thus the distance between the substrate 40 and the semiconductor package device 10 is relatively uniform after bonding, which is advantageous to the stability of the bonded structure (i.e., semiconductor package structure 5).

In some embodiments, the conductive bumps 20A and 30A may be disposed on the constraint structures 20 and 30 instead of on the metal pads 41 of the substrate 40 prior to bonding. In some embodiments, the conductive bumps 20A and 30A (e.g., solder pastes) may be disposed on the constraint structures 20 and 30 in a single operation, and thus the heights of the conductive bumps 20A and 30A can be relatively uniform prior to bonding, which is advantageous to the stability of the bonded structure (i.e., semiconductor package structure 5). In some embodiments, the conductive bumps 20A may be disposed on the constraint structures 20, and the conductive bumps 30A may be disposed on some of the metal pads 41 of the substrate 40 prior to bonding. In some embodiments, the conductive bumps 20A may be disposed on some of the metal pads 41 of the substrate 40, and the conductive bumps 30A may be disposed on the constrain structures 30 prior to bonding.

Figure 7E:
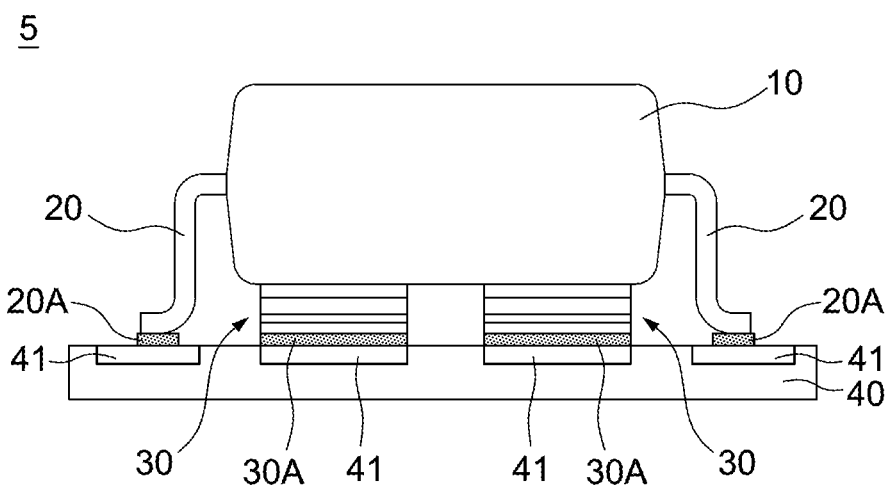

Referring to FIG. 7E, the semiconductor package device 10 is bonded to the substrate 40 through the constraint structures 20 and 30. As such, a semiconductor package structure 5 is formed.

In some embodiments, the semiconductor package device 10 is bonded to the substrate 40 through the constraint structures 20 and 30 in a single operation. In some embodiments, the constraint structures 20 and 30 are bonded to the metal pads 41 of the substrate 40 through solder pastes (i.e., the conductive bumps 20A and 30A) by surface mount technology (SMT). In some embodiments, the metal material of the constraint structure 20 and the metal layer 33 of the constraint structure 30 are bonded to the metal pads 41 of the substrate 40 through solder pastes (i.e., the conductive bumps 20A and 30A). Therefore, according to some embodiments of the present disclosure, self-alignment forces can be induced by the solder pastes due to the relatively strong cohesion forces of the solder pastes in the bonding process, and thus the fault tolerance for the bonding process can be increased.

In some other embodiments, the constraint structure 30 may be free from a conductive layer and/or a metal layer, and the constraint structure 30 may be bonded to the substrate 40 through an adhesive layer, for example, a non-conductive adhesive layer, or other suitable bonding technology.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An electronic device, comprising:
   a semiconductor package device;
   a substrate;
   a plurality of first constraint structures electrically connecting the semiconductor package device and the substrate, wherein the first constraint structures are connected to a first surface and a second surface of the semiconductor package device; and
   a plurality of second constraint structures connecting the semiconductor package device and the substrate, wherein the second constraint structures are connected to a third surface of the semiconductor package device, the third surface is extending from the first surface to the second surface, and the second constraint structures are under a projection of the semiconductor package device,
   wherein the semiconductor package device further has a fourth surface connected to the first surface and the third surface, and an amount of the second constraint structures adjacent to the first surface is greater than an amount of the second constraint structures adjacent to the fourth surface.

2. The electronic device of claim 1, wherein a maximum distance between two of the first constraint structures is greater than a maximum distance between one of the first constraint structures and one of the second constraint structures.

3. The electronic device of claim 1, wherein a distance between two of the first constraint structures on the first surface is greater than a distance between two of the second constraint structures on the third surface.

4. The electronic device of claim 1, wherein a distance between two of the first constraint structures on the first surface is greater than a distance between one of the first constraint structures and one of the second constraint structures.

5. The electronic device of claim 1, wherein a distance between one of the first constraint structures on the first surface and one of the first constraint structures on the second surface is greater than a distance between one of the first constraint structures and one of the second constraint structures.

6. The electronic device of claim 1, wherein a distance between one of the first constraint structures on the first surface and one of the first constraint structures on the second surface is greater than a distance between two of the second constraint structures on the third surface.

7. The electronic device of claim 1, wherein a ratio of a total area of the second constraint structures to an area of the third surface of the semiconductor package device is greater than about 10%.

8. A semiconductor package structure, comprising:
   a semiconductor package device;
   an electronic structure connected to the semiconductor package device; and
   a support structure connected to the semiconductor package device, the support structure comprising:
      a substrate core layer; and
      a metal layer formed on the substrate core layer, wherein a first surface of the electronic structure is substantially coplanar with a first surface of the support structure.

9. The semiconductor package structure of claim 8, wherein the substrate core layer is between the semiconductor package device and the metal layer.

10. The semiconductor package structure of claim 8, wherein a lateral surface of the substrate core layer is substantially aligned with a lateral surface of the metal layer.

11. The semiconductor package structure of claim 8, wherein a peripheral region of the substrate core layer is exposed from the metal layer.

12. The semiconductor package structure of claim 8, wherein the support structure further comprises a metal finish layer formed on the metal layer.

13. The semiconductor package structure of claim 8, wherein the support structure has a second surface opposite to the first surface, the electronic structure has a second surface opposite to the first surface, and an elevation of the second surface of the support structure is between an elevation of the first surface and an elevation of the second surface of the electronic structure.

14. The semiconductor package structure of claim 8, further comprising a plurality of the electronic structures and a plurality of the support structures, wherein the electronic structures comprise a plurality of lead pins, and the support structures comprise a plurality of singulated printed circuit boards (PCB).

15. An electronic device, comprising:
    a semiconductor package device;
    a substrate;
    a first constraint structure electrically connecting the semiconductor package device and the substrate; and
    a second constraint structure connecting the semiconductor package device and the substrate, wherein the second constraint structure is under a projection of the semiconductor package device, wherein the second constraint structure comprises:
       a metal layer;
       a substrate core layer between the metal layer and the semiconductor package device; and
       a metal finish layer between the metal layer and the substrate.

16. The electronic device of claim 15, further comprising a conductive bump directly contacting the second constraint structure and the substrate.

17. The electronic device of claim 15, wherein a lateral surface of the metal finish layer is substantially aligned with a lateral surface of the metal layer, and the lateral surface of the metal layer is recessed from a lateral surface of the substrate core layer.

* * * * *